United States Patent
Emoto

(10) Patent No.: US 9,382,475 B2
(45) Date of Patent: Jul. 5, 2016

(54) PHOSPHOR, LIGHT-EMITTING DEVICE AND USE THEREOF

(75) Inventor: Hideyuki Emoto, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 236 days.

(21) Appl. No.: 13/885,096

(22) PCT Filed: Nov. 16, 2011

(86) PCT No.: PCT/JP2011/076352
§ 371 (c)(1),
(2), (4) Date: Aug. 23, 2013

(87) PCT Pub. No.: WO2012/067130
PCT Pub. Date: May 24, 2012

(65) Prior Publication Data
US 2013/0328478 A1    Dec. 12, 2013

(30) Foreign Application Priority Data
Nov. 16, 2010   (JP) .................. 2010-255561

(51) Int. Cl.
*C09K 11/77* (2006.01)
*H01L 33/50* (2010.01)
(Continued)

(52) U.S. Cl.
CPC ......... *C09K 11/7721* (2013.01); *C09K 11/0883* (2013.01); *H05B 33/14* (2013.01); *H01L 33/502* (2013.01); *Y02B 20/181* (2013.01)

(58) Field of Classification Search
CPC ........... C09K 11/7721; C09K 11/7706; C09K 11/7703; C09K 11/77; C09K 11/7715; C09K 11/08; C09K 11/643; C09K 11/64; C09K 11/0838; C09K 11/7718; H01L 33/502; H05B 33/14; Y02B 20/181

USPC ............... 252/301.4 F, 301.4 R; 313/503
See application file for complete search history.

(56) References Cited

U.S. PATENT DOCUMENTS

2007/0114548 A1* 5/2007 Setlur et al. ............. 257/98
2007/0114562 A1  5/2007 Radkov et al. ........... 257/103
(Continued)

FOREIGN PATENT DOCUMENTS

| CN | 101629077 A | 1/2010 |
| EP | 1 887 067 A1 | 2/2008 |

(Continued)

OTHER PUBLICATIONS

Chinese Office Action mailed Mar. 1, 2014, issued in corresponding Chinese Application No. 201180055316.5.
(Continued)

*Primary Examiner* — Matthew E Hoban
*Assistant Examiner* — Lynne Edmondson
(74) *Attorney, Agent, or Firm* — Stein IP, LLC

(57) ABSTRACT

The present invention provides: a phosphor which can be combined with a blue LED to emit white light having a low color temperature as in the case where the phosphor is used singly, has a broad fluorescence spectrum, high light emission efficiency, and thermal/chemical stability, and rarely undergoes the deterioration in brightness at higher temperatures. This phosphor is represented by the general formula: $M_x(Si,Al)_2(N,O)_{3\pm y}$ (wherein M independently represent Li or at least one alkali earth metal element; and x and y fulfill the requirement represented by the formulae: $0.52 \leq x \leq 0.9$ and $0 \leq y \leq 0.3$) wherein some of M are substituted by element Ce, and wherein the Si/Al atomic ratio is 1.5 to 6 inclusive, the O/N atomic ratio is 0 to 0.1 inclusive, 5-50 mol % of M's is Li, and 0.5-10 mol % of M is Ce.

18 Claims, 2 Drawing Sheets

(51) Int. Cl.
*H05B 33/14* (2006.01)
*C09K 11/08* (2006.01)

(56) References Cited

U.S. PATENT DOCUMENTS

| | | | |
|---|---|---|---|
| 2009/0066230 A1* | 3/2009 | Hirosaki | C01B 21/0602 313/504 |
| 2010/0133563 A1 | 6/2010 | Schmidt et al. | 257/98 |
| 2012/0019127 A1 | 1/2012 | Hirosaki | 313/503 |

FOREIGN PATENT DOCUMENTS

| | | |
|---|---|---|
| JP | 2004-71726 | 3/2004 |
| JP | 2004-244560 | 9/2004 |
| JP | 2008-163078 A | 7/2008 |
| JP | 2010-153746 | 7/2010 |
| JP | 2010-275437 | 12/2010 |
| WO | WO 2006/087661 A1 | 8/2006 |
| WO | WO 2007/120216 | 10/2007 |
| WO | WO 2008/015207 | 2/2008 |
| WO | WO 2010/110457 A1 | 9/2010 |

OTHER PUBLICATIONS

European Search Report mailed Apr. 2, 2014, issued in corresponding European Application No. 11871642.9.
International Search Report for PCT/JP2011/076352; mailed Jan. 17, 2012; 4 pages.
Y.Q. Li, et al., *Yellow-Orange-Emitting $CaAlSiN_3:Ce^{3+}$ Phosphor: Structure, Photoluminescence, and Application in White LEDS*, American Chemical Society, 2005, pp. 6704-6714.
Chinese Office Action mailed Mar. 11, 2014, issued in corresponding Chinese Application No. 201180055316.5.
Taiwanese Office Action issued to Taiwanese Application No. 100141793, mailed Feb. 26, 2015.

* cited by examiner

PHOSPHOR, LIGHT-EMITTING DEVICE AND USE THEREOF

CROSS-REFERENCE TO RELATED APPLICATIONS

This application is a national stage application of PCT Application No. PCT/JP2011/076352, filed Nov. 16, 2011, which claims the benefit of Japanese Application No. JP 2010-255561, filed Nov. 16, 2010, in the Japanese Intellectual Property Office, the disclosures of which are incorporated herein by reference.

BACKGROUND OF THE INVENTION

1. Field of the Invention

The present invention relates to a phosphor that emits orange-red light, and a light-emitting device, an image display device, and a lighting device using the phosphor.

2. Description of the Related Art

Patent Document 1 discloses a light-emitting device that uses a YAG phosphor in combination with an orange-red nitride or oxynitride phosphor to complement the red component of a white LED. In Patent Documents 2 and 3, there are $Eu^{2+}$-doped $(Ca,Sr)_2(Si,Al)_5N_8$ and $(Ca,Sr)AlSiN_3$ as typical phosphors that emit orange-red light.

Patent Document 1: Japanese Unexamined Patent Application, Publication No. 2004-071726 (paragraph[0037])

Patent Document 2: Japanese Unexamined Patent Application, Publication No. 2004-244560 (paragraph[0056])

Patent Document 3: Japanese Unexamined Patent Application, Publication No. 2010-153746 (paragraph[0012])

SUMMARY OF THE INVENTION

With respect to the combination of a blue LED, a green-yellow phosphor represented by YAG, and a orange-red phosphor composed of nitride/oxynitride combined to improve color rendering properties of a white LED, since the excitation band of the nitride/oxynitride phosphor extends as far as the yellow region, part of green-yellow fluorescence emission serves as an excitation source of the nitride-based phosphor. Accordingly, there is a problem in that the luminous intensity of a light-emitting device in which multiple phosphors are combined is lower than that of a single phosphor. In particular, such an effect is evident in a light source having a low color temperature in which a reddish phosphor is used in a high proportion.

$Eu^{2+}$-doped $\alpha$-SiAlON phosphors and $Ce^{3+}$-doped $CaAlSiN_3$ phosphors in combination with a blue LED independently yield light sources having a low color temperature, for example, the color of a warm white fluorescent lamp, but $\alpha$-SiAlON phosphors are disadvantageous in that their color rendering properties are poor because the width of the fluorescence spectrum is significantly narrower than that of YAG phosphors, and $CaAlSiN_3$ phosphors are disadvantageous in that their luminous efficiency is poor and a sufficient luminance is not obtained.

An object of the present invention is to provide a phosphor that emits orange light, and a light-emitting device, an image display device, and a lighting device using the phosphor, in particular, to provide a phosphor that in combination with a blue LED yields white light having a low color temperature similar to that obtained in independent use, has a broad fluorescence spectrum advantageous for attaining enhanced color rendering properties, has a high luminous efficiency, has thermal/chemical stability that is characteristic of conventional nitride-based phosphors, and undergoes little luminance deterioration at high temperatures, and devices using the phosphor.

As a result of having conducted extensive research on various nitride and oxynitride phosphors to solve the foregoing problems, the inventors found that a phosphor containing a crystal phase that has a specific chemical composition is an excellent phosphor that solves the foregoing problems, and arrived at the present invention.

The present invention is a phosphor represented by formula $M_x(Si,Al)_2(N,O)_{3\pm y}$, provided that M is Li and at least one alkaline earth metal element, $0.52 \le x \le 0.9$, $0 \le y \le 0.3$, and part of M is replaced by element Ce, wherein an Si/Al atomic ratio (molar ratio) is 1.5 or greater and 6 or less, an O/N atomic ratio (molar ratio) is 0 or greater and 0.1 or less, 5 to 50 mol % of M is Li, and 0.5 to 10 mol % of M is Ce.

It is preferable that 0.5 to 5 mol % of M is Ce.

It is preferable that the alkaline earth metal element is Ca.

It is preferable that the phosphor has an orthorhombic crystal structure and contains a crystal with a lattice constant a of 0.935 to 0.965 nm, a lattice constant b of 0.550 to 0.570 nm, and a lattice constant c of 0.480 to 0.500 nm.

It is preferable that the phosphor has an orthorhombic crystal structure and consists of a crystal with a lattice constant a of 0.935 to 0.965 nm, a lattice constant b of 0.550 to 0.570 nm, and a lattice constant c of 0.480 to 0.500 nm and a heterogeneous crystal phase, and the diffraction intensity of the most intense line of the heterogeneous crystal phase relative to the diffraction intensity of the most intense line of the crystal having the specified lattice constants evaluated according to powder X-ray diffractometry is 40% or less.

It is preferable that the heterogeneous crystal phase is $\alpha$-SiAlON, AlN, or $LiSi_2N_3$.

Another aspect of the invention is a light-emitting device having the phosphor and a light-emitting source.

Another aspect of the invention is the light-emitting device, wherein the light-emitting source emits ultraviolet or visible light.

Another aspect of the invention is an image display device having the light-emitting device.

Another aspect of the invention is a lighting device having the light-emitting device.

The phosphor of the present invention is an oxynitride orange phosphor that has a higher luminance and a broader spectrum, has a higher luminous efficiency, has a better thermal/chemical stability, and undergoes less luminance deterioration at high temperatures than conventional phosphors, and is suitably used in a light-emitting device that uses light in the ultraviolet to visible light region as an excitation source. The light-emitting device, image display device, and lighting device of the present invention use the above-described phosphor and thus have high luminance.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
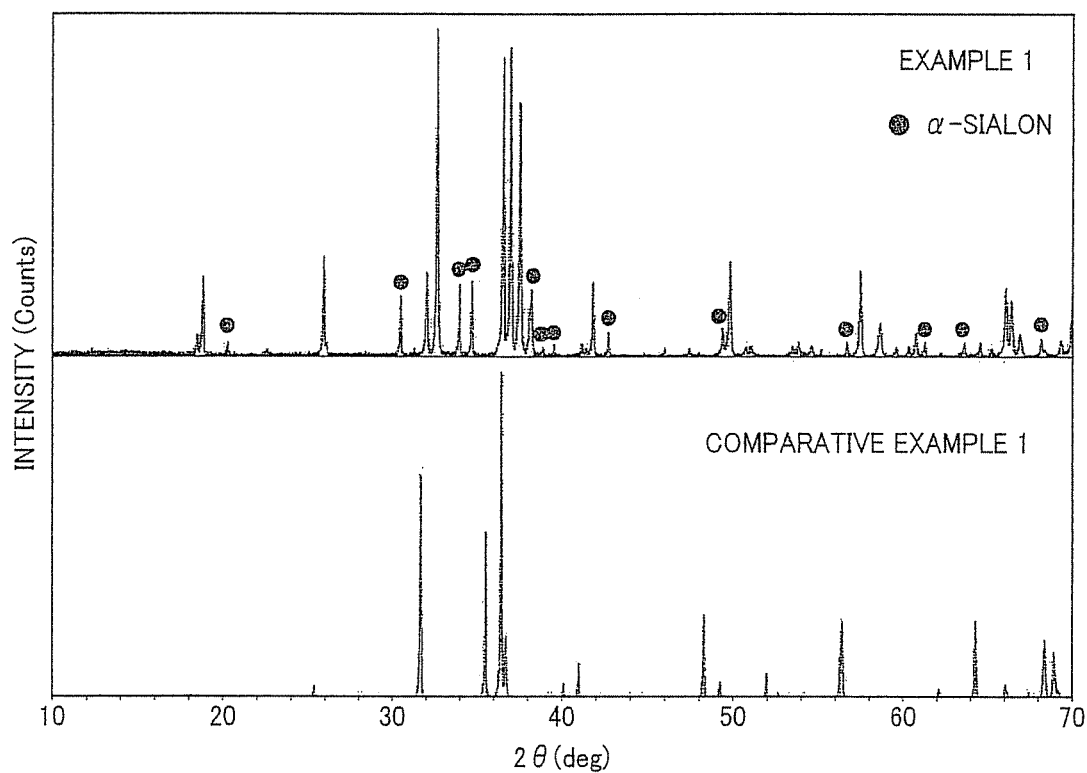
FIG. 1 is a diagram showing the X-ray diffraction patterns of the phosphors of Example 1 and Comparative Example 1.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

The present invention will now be described in detail below.

The phosphor of the present invention is an oxynitride phosphor represented by formula $M_x(Si,Al)_2(N,O)_{3\pm y}$. The skeletal structure of this material is constituted by bonding of (Si,Al)—(N,O)$_4$ regular tetrahedrons, and the element M is present in the gap. This composition is achieved in a broad range where electroneutrality is maintained in accordance with the entire parameters of the valency and amount of the element M, the Si/Al ratio, and the N/O ratio. A typical phosphor represented by this formula is CaAlSiN$_3$ where the element M is Ca, x=1, Si/Al=1, and O/N=0. When part of Ca in CaAlSiN$_3$ is replaced with Eu, the phosphor becomes a red phosphor, and when part of Ca is replaced with Ce, the phosphor becomes an orange phosphor. The red phosphor has a very high luminous efficiency and has been brought into practical use, but the phosphor does not yield as much luminous efficiency as the phosphor with Eu when a solid solution is formed with Ce using the same host crystal.

The phosphor of the present invention is based on the CaAlSiN$_3$ crystal, and a feature of the phosphor is that the constituent elements and composition are greatly altered so as to be able to obtain a very high luminous efficiency even when Ce is doped. In the phosphor of the present invention having the formula, the element M is a combination of element Li and an alkaline earth metal element, and part of the element M is replaced with element Ce that serves as a luminescence center. Use of element Li in combination with the divalent alkaline earth element and the trivalent element Ce allows the average valency of the element M to be controlled broadly. Li$^+$ has a very small ionic radius, and it is possible to greatly alter the crystal size by the amount thereof, and various fluorescent emissions can be obtained. It is preferable that the coefficient x of the element M in the formula is in the range of 0.52 to 0.9. The fluorescence intensity tends to be impaired when the coefficient x exceeds 0.9, or that when the crystal is closer to CaAlSiN$_3$, and when the coefficient x is less than 0.52, large amounts of heterogeneous phase that is different from the intended crystal phase is generated, and therefore the fluorescence intensity is significantly impaired.

In the crystal constituting the phosphor of the present invention, when electroneutrality is maintained due to the average valency and amount of the element M, Si/Al ratio, and O/N ratio, and the crystal is a single crystal without any defect or the like, y=0. However, in view of the composition of the entire phosphor, when a secondary crystal phase or an amorphous phase is present, or in view of the crystal itself, when there is a crystal defect, the charge balance is lost. In the present invention, from the viewpoint of increasing the intended crystal phase and raising the fluorescence intensity, it is preferable that y is 0 or greater and 0.3 or less.

When the preferable O/N atomic ratio (molar ratio) of the phosphor of the present invention is excessively high, the amount of heterogeneous phase generated is increased, and thus the luminous efficiency is impaired and the covalent bonding of the crystal is impaired, and there is a tendency to cause deterioration of temperature characteristics (deterioration of luminance at high temperatures). When the ratio is excessively low, the composition is close to a nitride and thus the luminous efficiency tends to be high, but oxygen derived from raw materials inevitably forms a solid solution within the crystal. Therefore, the ratio has to be 0 or greater and 0.1 or less.

The Si/Al atomic ratio (molar ratio) is automatically determined when the average valency and amount of the element M and the O/N atomic ratio are in specific ranges, and the Si/Al ratio is in the range of 1.5 or greater and 6 or less.

It is preferable that the Li content of the phosphor of the present invention is 5 to 50 mol % of the element M. The effect of Li is likely to be demonstrated at 5 mol % or greater, but when the content exceeds 50 mol %, the intended crystal structure of the phosphor cannot be maintained, and thus a heterogeneous phase is generated and the luminous efficiency is likely to be impaired. The Li content here is a value representing Li contained in the phosphor eventually obtained, and is not the content in the raw material formulation. This is because the Li compound used as a raw material has a high vapor pressure and is likely to volatilize, and when an attempt is made to synthesize a nitride/oxynitride at high temperatures, considerable amounts of Li volatilizes. That is, the amount of Li in the raw material formulation is greatly different from the content in the final product, and therefore it does not mean the Li content in the phosphor.

When the content of Ce, which is the luminescence center of the phosphor of the present invention, is excessively small, a contribution to luminescence tends to be small, and when the content is excessively large, concentration quenching of the phosphor due to energy transfer between Ce$^{3+}$ ions tends to occur. Therefore, it is preferable that the content is 0.5 to 5 mol % of the element M.

Any alkaline earth metal element may be used for the element M of the phosphor of the present invention, and when Ca is used, a high fluorescence intensity is obtained and the crystal structure is stable over a broad compositional range, and therefore Ca is preferable. Multiple alkaline earth metal elements may be used in combination, and for example, part of element Ca may be replaced with element Sr.

The crystal structure of the present invention may be orthorhombic, and may be the same as the aforementioned CaAlSiN$_3$ crystal. The lattice constants of the CaAlSiN$_3$ crystal are a=0.98007 nm, b=0.56497 nm, and c=0.50627 nm. The lattice constants of the phosphor of the present invention are a=0.935 to 0.965 nm, b=0.550 to 0.570 nm, and c=0.480 to 0.500 nm, and thus the values are all smaller than those of the CaAlSiN$_3$ crystal. These lattice constant ranges reflect the above-described constituent elements and composition, and values outside these ranges are likely to result in impaired fluorescence intensity, and thus are not preferable.

It is preferable that the crystal phase present in the phosphor is the aforementioned single crystal phase, but a heterogeneous phase may be included as long as the fluorescence characteristics are not greatly affected. Examples of heterogeneous phases unlikely to affect fluorescence characteristics include α-SiAlON, AlN, LiSi$_2$N$_3$, and the like. It is preferable that the amount of heterogeneous phase is such an amount that the most intense diffraction line intensity of the heterogeneous crystal phase relative to the most intense diffraction line intensity of the aforementioned crystal phase evaluated by powder X-ray diffractometry is 40% or less.

The phosphor of the present invention having the aforementioned constitutional requirements is excited by light of a broad wavelength region, i.e., ultraviolet to visible light, and for example, when irradiated with blue light having a wavelength of 450 nm, the phosphor may show a broad florescence emission, with the dominant wavelength being 570 to 590 nm and thus orange, and the half width of the fluorescence spectrum being 125 nm or greater, and the phosphor is suitable as a phosphor for a broad range of light-emitting devices. Moreover, the phosphor of the present invention has excellent heat resistance and chemical stability as with conventional nitride/oxynitride-based phosphors represented by $CaAlSiN_3$, and also has a feature that luminance deterioration at high temperatures is small, and therefore the phosphor is suitable in applications where durability in particular is required.

A method for producing the phosphor of the present invention as described above is not particularly specified, an example presented here is a method in which a raw material mixture that is a mixture of metal compounds and can form a composition represented by the aforementioned formula by calcination is calcined in a nitrogen atmosphere in a specific temperature range.

As raw material powder, nitrides of constituent elements, i.e., silicon nitride, aluminum nitride, lithium nitride, cerium nitride, and a nitride of an alkaline earth element are suitably used. Generally, nitride powder is unstable in air, and the particle surface is covered with an oxide layer, and even when nitride raw materials are used, a certain amount of oxide is consequently contained in the raw materials. When controlling the O/N ratio of the phosphor, these facts should be taken into consideration, and if oxygen is short, part of nitride is replaced with oxide (include a compound that forms oxide by heat treatment).

Among the raw material powders, a lithium compound significantly volatilizes by heating, and may mostly volatilize depending on the calcining condition. Therefore, it is necessary to determine the amount of lithium compound to be blended in consideration of the amount of lithium volatilized in the calcination process according to the calcination condition.

Among the nitride raw material powders, lithium nitride, cerium nitride, and an alkaline earth element nitride vigorously react with moisture and oxygen present in air, and therefore these substances are handled in a glove box replaced to have an inert atmosphere. Specific amounts of silicon nitride, aluminum nitride, and various oxide raw material powders that can be handled in air are weighted, sufficiently mixed in air in advance, delivered to a glove box, and sufficiently mixed with the aforementioned nitride raw materials, and the mixed powder is charged in a calcination container.

It is preferable that the calcination container is made of a material that is stable in a high-temperature nitrogen atmosphere and does not react with raw material powders or a reaction product thereof, and a calcination container made of boron nitride is suitably used.

A boron nitride calcination container filled with mixed raw material powder is removed from a glove box, promptly placed in a calcination furnace, and calcined in a nitrogen atmosphere at 1600 to 2000° C. When the calcination temperature is lower than 1600° C., the amount of unreacted material remaining is large, and when the calcination temperature exceeds 2000° C., the intended crystal structure cannot be maintained due to the significant volatilization of lithium element.

The calcination time is selected such that disadvantages, for example, a large amount of unreacted material remains or the amount of volatilized lithium is significant, are not created, and is preferably about 2 to 24 hours.

The pressure of the calcination environment is selected according to the calcination temperature. The phosphor of the present invention can stably exist under atmospheric pressure at temperatures up to about 1800° C., but the phosphor needs to be in a pressurized atmosphere at 1800° C. or higher to suppress decomposition of the phosphor. The higher the environment pressure, the higher the decomposition temperature of the phosphor, and it is preferable in consideration of industrial productivity that the environment pressure is less than 1 MPa.

The state of the calcination product varies according to the raw material formulation and calcination conditions, e.g., powder, mass, and a sintered body. When used as a phosphor, the calcination product is processed into powder having a specific size using disintegration, pulverization, and/or classification operations in combination. To suitably use the calcination product as a phosphor for LEDs, it is preferable to adjust the average particle size of the calcination product so as to be 6 to 30 μm.

In the production of the phosphor, it is preferable to further perform an acid cleaning process to remove impurities and an annealing treatment process to improve crystallinity.

EXAMPLE 1

Below, the present invention will now be described in more detail by way of examples.

76.70 mass % of α-silicon nitride powder (SN-E10 grade manufactured by Ube Industries Ltd., oxygen content of 1.0 mass %), 18.94 mass % of aluminum nitride powder (E grade manufactured by Tokuyama Corporation, oxygen content of 0.8 mass %), 0.72 mass % of aluminum oxide (TM-DAR grade manufactured by Taimei Chemicals Co., Ltd.), and 3.64 mass % of cerium oxide powder (C type manufactured by Shin-Etsu Chemical Co., Ltd.) were ball mill-mixed using a silicon nitride pot and balls and using ethanol as a solvent. After the solvent was removed by drying, the mixed powder was passed through a sieve having a 75 μm mesh opening to remove aggregates.

The mixed powder was placed in a nitrogen-replaced glove box and mixed with calcium nitride powder (manufactured by Kojundo Chemical Laboratory Co., Ltd., purity of 99%) and lithium nitride powder (manufactured by Kojundo Chemical Laboratory Co., Ltd., purity of 99%) using an agate mortar. The mixing ratio was the mixed powder:calcium nitride powder:lithium nitride powder=77.12:18.15:4.74 mass %. The resulting mixed raw material powder was charged in a cylindrical boron nitride container equipped with a lid (N-1 grade manufactured by Denki Kagaku Kogyo Kabushiki Kaisha), removed from the glove box, and promptly placed in a carbon heater electric furnace, and the furnace was sufficiently evacuated to 0.1 Pa or less. With the furnace being evacuated, heating was started, nitrogen gas was introduced at 600° C., and the atmosphere pressure in the furnace was set at 0.8 MPa. Heating was continued also after gas introduction to 1800° C., and calcination was carried out at 1800° C. for 4 hours.

After cooling, the sample recovered from the furnace was orange mass. This mass was disintegrated until it entirely passed through a sieve having a 150 μm mesh opening. The resulting disintegrated product was eventually passed through a sieve having a 45 μm mesh opening, and the powder that had passed through the sieve was regarded as the final product (phosphor). The average particle size of the phosphor obtained by a laser diffraction/scattering method was 18 μm.

A compositional analysis of the resulting phosphor was performed in the following manner. The Ca, U. Ce, Si, and Al contents were measured using an ICP emission spectrophotometer (CIROS-120 manufactured by Rigaku Corporation) after the powder was dissolved by alkali fusion. The oxygen and nitrogen contents were measured using an oxygen nitrogen analyzer (EMGA-920 manufactured by Horiba Ltd.). The composition of this powder was Ca:Li:Ce:Si:Al:O:N=8.08:3.18:0.34:28.1:8.38:2.31:49.6 at %. Applying this to the aforementioned formula yielded x=0.64, y=0.15, Si/Al (molar ratio)=3.57. and O/N (molar ratio)=0.047. While the Li content was 8.3 at % in the raw material formulation, the Li content was significantly small at 3.2 at % in the resulting phosphor.

Powder X-ray diffraction (XRD) using CuKα radiation was performed on this phosphor using an X-ray diffractometer (Ultima IV manufactured by Rigaku Corporation). The resulting XRD pattern is shown in FIG. 1. It was found from an analysis of the XRD pattern that the phosphor was orthorhombic (or monoclinic) with a Cmc21 (or P21) space group, and contained a crystal with lattice constants a=0.9445 nm, b=0.5591 nm, and c=0.4918 nm as a main phase and α-SiAlON as another crystal phase. The intensity of the most intense line of the α-SiAlON relative to the intensity of the most intense line of the orthorhombic crystal was 21%.

COMPARATIVE EXAMPLE 1

Raw materials were blended in order to give a known CaAlSiN$_3$ phosphor. The formulation was to have a formula (Ca$_{0.98}$Li$_{0.01}$Ce$_{0.01}$)SiAlN$_3$. With regard to the formulation, the amount of oxygen in each nitride raw material was disregarded, an oxide raw material was used for Ce, and the formulation was calculated in terms of nitride. Addition of Li here was for charge compensation of Ce$^{3+}$. As in Example 1, after performing preliminary mixing in the atmosphere and mixing in a glove box, calcination and processing of the calcination product were performed under the same conditions as in Example 1.

The XRD pattern of Comparative Example 1 is shown in FIG.
1. It was found that the diffraction pattern of Comparative Example 1 is greatly different from the diffraction pattern of Example 1 and has the same diffraction pattern as a known CaAlSiN$_3$ crystal. An analysis of the XRD pattern revealed that the crystal system and space group were the same orthorhombic system and Cmc21, respectively, as in Example 1, thus having the same crystal structure. In the phosphor of Comparative Example 1, no clear crystal phase was found other than the CaAlSiN$_3$ crystal. The lattice constants were a=0.9789 nm, b=0.5659 nm, and c=0.5063 nm.

The chemical composition of the phosphor of Comparative Example 1 was measured by the same method as in Example 1, and as a result, the composition was Ca:Li:Ce:Si:Al:O:N=16.1:0.03:0.16:17:17.2:1.28:48.3 at %. Applying this to the formula yielded x=0.95, y=0.10, Si/Al=0.99, and O/N=0.03. Although XRD showed a single CaAlSiN$_3$ crystal phase, unintentional mixing of oxygen derived from the raw materials, volatilization of some components in the calcination process, and the like occurred, and the composition was slightly different and was not exactly x=y=1, Si/Al=1, and O/N=0.

Figure 2:
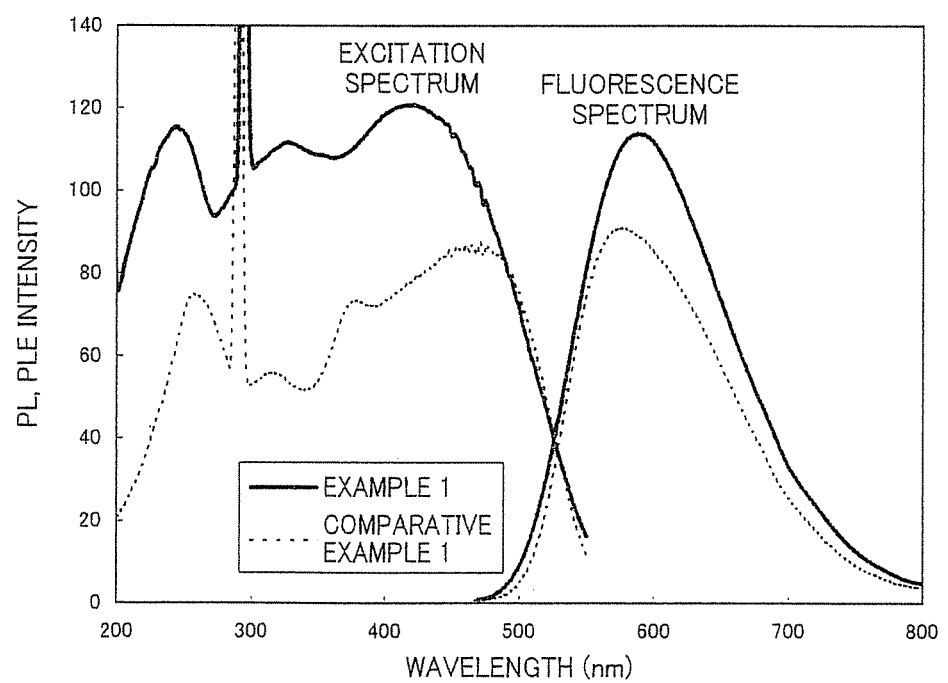
FIG. 2 is a diagram showing the excitation and fluorescence spectra of the phosphors of Example 1 and Comparative Example 1.

Next, measurement of excitation and fluorescence spectra was carried out using a spectrofluorometer (F7000 manufactured by Hitachi High-Technologies Corporation). The excitation wavelength of the fluorescence spectrum was 455 nm, and the monitor wavelength of the excitation spectrum was the peak wavelength of the fluorescence spectrum of 455 nm excitation. Results are shown in FIG. 2. In the figure, the vertical axis indicates the relative emission intensity. Since the fluorescence peak intensity varies according to the measurement device and conditions, the unit is arbitrary, and the example and the comparative example measured under the same conditions were compared.

As shown in FIG. 2, the phosphors were both excited by a broad wavelength of ultraviolet to green light, and Example 1 showed a fluorescence spectrum with a peak wavelength of 590 nm, a dominant wavelength of 581 nm, and a half width of 132 nm, and Comparative Example 1 showed a fluorescence spectrum with a peak wavelength of 580 nm, a dominant wavelength of 581 nm, and a half width of 124 nm. The fluorescence integrated intensity of Example 1 in the range of 470 to 780 nm wavelength was 126%, with that of Comparative Example 1 being 100%. The phosphor of Example 1 showed a higher fluorescence intensity than simple CaAlSiN$_3$:Ce (Comparative Example 1).

Figure 3:
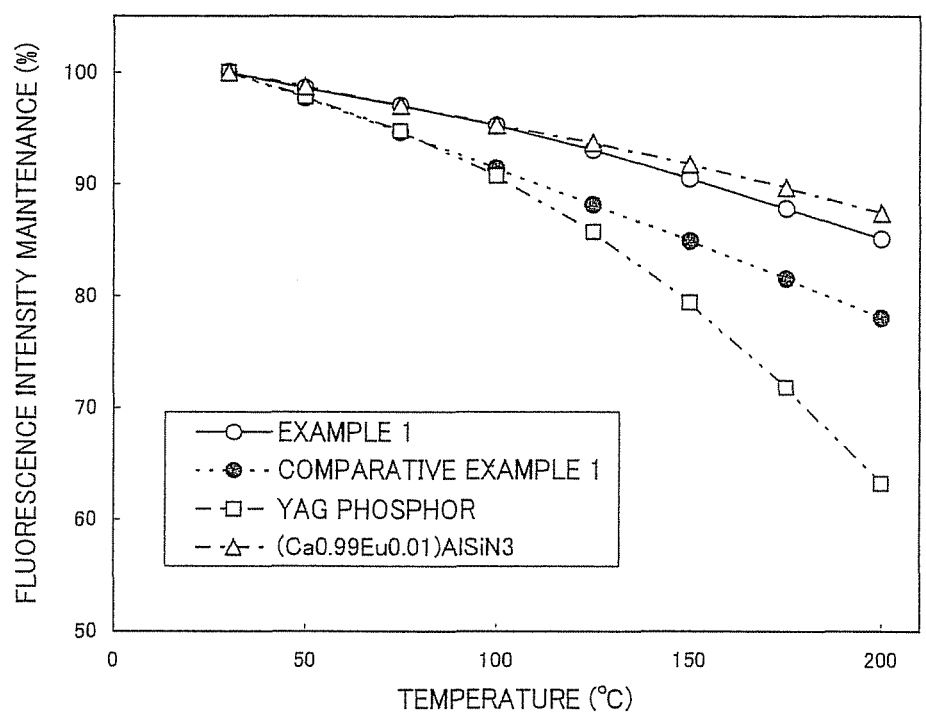
FIG. 3 is a diagram showing the emission intensities of Example 1, Comparative Example 1, a YAG phosphor, and a CaAlSiN$_3$:Eu phosphor at various temperatures relative to their emission intensities at room temperature.

The fluorescence temperature characteristics in the temperature range of 30 to 200° C. of the phosphors of Example 1 and Comparative Example 1 were measured using a fluorescence temperature characteristics evaluation apparatus manufactured by Otsuka Electronics Co., Ltd. The temperature dependency of the fluorescence peak intensity is shown in FIG. 3. As a reference, FIG. 3 also shows data of a YAG phosphor (P46Y3) and a (Ca$_{0.99}$Eu$_{0.01}$)AlSiN$_3$ red phosphor synthesized by the same method as in Comparative Example 1. The temperature characteristics of the CaAlSiN$_3$:Ce phosphor of Comparative Example 1 is superior to those of the YAG phosphor but inferior to those of the CaAlSiN$_3$:Eu phosphor. Example 1 has better temperature characteristics than Comparative Example 1 and is close to the CaAlSiN$_3$:Eu phosphor.

EXAMPLES 2 TO 6 AND COMPARATIVE EXAMPLES 2 TO 6

Using the same raw material powders as in Example 1, the total formulations shown in Table 1 were employed, and the phosphors of Examples 2 to 6 and Comparative Examples 2 to 6 were obtained by performing exactly the same processing as in Example 1. Evaluation results are shown in Tables 2 and 3 together with the results of Example 1 and Comparative Example 1.

TABLE 1

| | | Compositions of all mixtures (mass %) | | | | | |
|---|---|---|---|---|---|---|---|
| | | Si$_3$N$_4$ | AlN | Al$_2$O$_3$ | CeO$_2$ | Ca$_3$N$_2$ | Li$_3$N |
| Example | 1 | 59.15 | 14.61 | 0.55 | 2.81 | 18.15 | 4.74 |
| | 2 | 48.96 | 20.24 | 0.53 | 2.67 | 24.91 | 2.70 |
| | 3 | 64.65 | 11.56 | 0.57 | 2.88 | 14.49 | 5.84 |
| | 4 | 62.12 | 10.89 | 3.39 | 2.86 | 6.41 | 4.34 |
| | 5 | 56.14 | 17.61 | — | 2.53 | 19.78 | 3.95 |
| | 6 | 18.80 | 3.75 | — | 5.74 | 18.80 | 3.75 |
| Comparative | 1 | 33.88 | 29.70 | — | 1.25 | 35.09 | 0.08 |
| Example | 2 | 39.73 | 25.34 | 0.50 | 2.54 | 31.03 | 0.86 |
| | 3 | 70.46 | 8.35 | 0.59 | 2.96 | 10.64 | 7.00 |
| | 4 | 65.19 | 7.04 | 6.32 | 2.91 | 14.61 | 3.92 |
| | 5 | 60.59 | 14.35 | 1.34 | 0.29 | 18.59 | 4.85 |
| | 6 | 47.23 | 19.93 | — | 12.88 | 16.64 | 3.32 |

TABLE 2

| | Compositions of synthesized powders (at %) | | | | | | | Compositional parameter | | | | | |
|---|---|---|---|---|---|---|---|---|---|---|---|---|---|
| | Ca | Li | Ce | Si | Al | O | N | x | y | Si/Al | O/N | Li/M (mol %) | Ce/M (mol %) |
| Example1 | 8.08 | 3.18 | 0.34 | 28.10 | 8.35 | 2.31 | 49.64 | 0.69 | 0.15 | 3.36 | 0.05 | 27.40 | 2.90 |
| Example2 | 11.45 | 1.06 | 0.33 | 23.78 | 11.54 | 2.36 | 49.49 | 0.73 | 0.06 | 2.06 | 0.05 | 8.27 | 2.56 |
| Example3 | 6.24 | 5.35 | 0.34 | 30.34 | 6.57 | 2.13 | 49.02 | 0.65 | 0.23 | 4.62 | 0.04 | 44.85 | 2.86 |
| Example4 | 7.30 | 2.90 | 0.34 | 29.47 | 7.54 | 3.71 | 48.73 | 0.57 | 0.17 | 3.91 | 0.08 | 27.54 | 3.25 |
| Example5 | 8.74 | 5.05 | 0.30 | 26.31 | 9.39 | 2.30 | 47.91 | 0.79 | 0.19 | 2.80 | 0.05 | 35.81 | 2.14 |
| Example6 | 8.40 | 4.77 | 0.70 | 25.43 | 10.03 | 3.10 | 47.56 | 0.78 | 0.14 | 2.54 | 0.07 | 34.40 | 5.03 |
| Comparative Example1 | 16.10 | 0.03 | 0.16 | 17.00 | 17.17 | 1.28 | 48.25 | 0.95 | 0.10 | 0.99 | 0.03 | 0.19 | 0.99 |
| Comparative Example2 | 14.38 | 0.04 | 0.32 | 19.98 | 14.44 | 2.15 | 48.68 | 0.86 | 0.05 | 1.38 | 0.04 | 0.28 | 2.19 |
| Comparative Example3 | 4.58 | 7.60 | 0.35 | 31.69 | 4.49 | 2.10 | 49.18 | 0.69 | 0.17 | 7.05 | 0.04 | 60.65 | 2.77 |
| Comparative Example4 | 6.42 | 2.59 | 0.34 | 30.54 | 6.63 | 6.20 | 47.27 | 0.50 | 0.12 | 4.61 | 0.13 | 27.73 | 3.68 |
| Comparative Example5 | 8.10 | 3.18 | 0.03 | 28.72 | 8.37 | 1.85 | 49.74 | 0.61 | 0.22 | 3.43 | 0.04 | 28.13 | 0.31 |
| Comparative Example6 | 7.76 | 4.30 | 1.64 | 23.55 | 11.30 | 6.12 | 45.33 | 0.79 | 0.05 | 2.08 | 0.14 | 31.37 | 11.96 |

TABLE 3

| | | Powder X-ray diffraction | | | | Fluorescence characteristics (Excitation wavelength: 455 nm) | | | |
|---|---|---|---|---|---|---|---|---|---|
| | | Lattice constant a (nm) | Lattice constant b (nm) | Lattice constant c (nm) | Secondary phase | | Fluorescence integrated intensity | Peak wavelength (nm) | Dominant wavelength (nm) | Half width (nm) |
| | | | | | Type | Intensity ratio | | | | |
| Example | 1 | 0.945 | 0.559 | 0.492 | α-SiAlON | 21% | 123 | 590 | 581 | 132 |
| | 2 | 0.953 | 0.563 | 0.497 | α-SiAlON | 12% | 123 | 590 | 583 | 128 |
| | 3 | 0.940 | 0.555 | 0.489 | α-SiAlON | 15% | 123 | 596 | 582 | 134 |
| | 4 | 0.943 | 0.558 | 0.491 | AlN | 5% | 108 | 586 | 580 | 132 |
| | 5 | 0.948 | 0.559 | 0.493 | LiSi2N3 | 9% | 126 | 590 | 581 | 133 |
| | 6 | 0.947 | 0.560 | 0.494 | LiSi2N3 | 7% | 130 | 597 | 585 | 136 |
| Comparative Example | 1 | 0.979 | 0.566 | 0.506 | None | — | 98 | 580 | 581 | 125 |
| | 2 | 0.968 | 0.565 | 0.503 | α-SiAlON | 11% | 92 | 587 | 581 | 126 |
| | 3 | 0.939 | 0.548 | 0.485 | LiSi2N3 | 4% | 98 | 592 | 579 | 138 |
| | 4 | 0.936 | 0.554 | 0.488 | α-SiAlON | 47% | 89 | 576 | 577 | 130 |
| | 5 | 0.949 | 0.558 | 0.493 | LiSi2N3 | 4% | 100 | 581 | 575 | 128 |
| | 6 | 0.947 | 0.562 | 0.495 | LiSi2N3, unknown | 10% | 72 | 603 | 587 | 142 |

EXAMPLE 7 AND COMPARATIVE EXAMPLE 7

The phosphors of Example 7 and Comparative Example 7 were obtained by performing exactly the same processing as in Example 1 using exactly the same raw material powders and raw material formulation as in Example 1. However, the calcination temperature in Example 7 was 1900° C., and 2000° C. in Comparative Example 7. Evaluation results are shown in Table 4 (composition) and Table 5 (physical properties) together with the results of Example 1.

TABLE 4

| | Calcination temperature (° C.) | Compositions of synthesized powders (at %) | | | | | | | Compositional parameter | | | | | |
|---|---|---|---|---|---|---|---|---|---|---|---|---|---|---|
| | | Ca | Li | Ce | Si | Al | O | N | x | y | Si/Al | O/N | Li/M (mol %) | Ce/M (mol %) |
| Example1 | 1800 | 8.03 | 3.16 | 0.33 | 28.55 | 8.30 | 2.30 | 49.33 | 0.63 | 0.20 | 3.44 | 0.05 | 27.40 | 2.90 |
| Example7 | 1900 | 8.10 | 2.45 | 0.33 | 28.68 | 8.24 | 2.25 | 49.96 | 0.59 | 0.17 | 3.48 | 0.04 | 22.51 | 3.00 |
| Comparative Example7 | 2000 | 8.17 | 0.96 | 0.34 | 28.99 | 8.44 | 2.25 | 50.85 | 0.51 | 0.16 | 3.43 | 0.04 | 10.11 | 3.55 |

TABLE 5

| | Powder X-ray diffraction | | | | | Fluorescence characteristics (Excitation wavelength: 455 nm) | | | |
|---|---|---|---|---|---|---|---|---|---|
| | Lattice constant a (nm) | Lattice constant b (nm) | Lattice constant c (nm) | Secondary phase | | Fluorescence integrated intensity | Peak wavelength (nm) | Dominant wavelength (nm) | Half width (nm) |
| | | | | Type | Intensity ratio | | | | |
| Example1 | 0.945 | 0.559 | 0.492 | α-SiAlON | 21% | 123 | 590 | 581 | 132 |
| Example6 | 0.944 | 0.559 | 0.492 | α-SiAlON | 32% | 115 | 590 | 582 | 131 |

TABLE 5-continued

| | Powder X-ray diffraction | | | | Fluorescence characteristics (Excitation wavelength: 455 nm) | | | |
|---|---|---|---|---|---|---|---|---|
| | Lattice constant a (nm) | Lattice constant b (nm) | Lattice constant c (nm) | Secondary phase Type | Intensity ratio | Fluorescence integrated intensity | Peak wavelength (nm) | Dominant wavelength (nm) | Half width (nm) |
| Comparative Example 11 | 0.944 | 0.559 | 0.492 | α-SiAlON | 46% | 99 | 592 | 583 | 130 |

Even when the same raw materials were used, the amount of Li was reduced and the value x was smaller as the calcination temperature was raised, and it was difficult to maintain the intended crystal structure, the amount of the secondary phase was significantly increased, and the fluorescence characteristics were significantly deteriorated.

EXAMPLE 8

After the phosphor of Example 1 was added to silicone resin and degassed and kneaded, the mixture was potted in a package of a surface mount type to which a blue LED element with a peak wavelength of 450 nm had been attached, and further the package was thermally cured to prepare a white LED. The chromaticity of this white LED was controlled by the amount of the phosphor added to the silicone resin so as to be within the warm white fluorescent lamp color in accordance with the light-source color classification of JIS Z 9112.

COMPARATIVE EXAMPLE 8

Using the phosphor of Comparative Example 1, an LED having the color of a warm white fluorescent lamp was prepared in the same manner as in Example 6.

COMPARATIVE EXAMPLE 9

A $CaCO_3$—$Si_3N_4$—AlN—$Eu_2O_3$ raw material system was calcined, the resulting calcination product was disintegrated and sieve-classified, and thus a Ca-α-SiAlON:Eu yellow phosphor having an average particle size of 18 μm was prepared. Evaluation of fluorescence characteristics at an excitation wavelength of 455 nm performed in the same manner as in Example 1 showed a peak wavelength of 588 nm, a dominant wavelength of 581 nm, a half width of 90 nm, and a fluorescence integrated intensity of 100%. Using this α-SiAlON phosphor, an LED having the color of a warm white fluorescent lamp was prepared in the same manner as in Example 6.

The emission characteristics under the same conditions of the LEDs having the color of a warm white fluorescent lamp prepared in Example 8 and Comparative Examples 8 and 9 were measured using an emission spectrometer (MCPD 7000) manufactured by Otsuka Electronics Co., Ltd.). Measurement was performed on multiple LEDs, and the luminous intensity, chromaticity, and general color rendering index were obtained. Measurement was performed on multiple LEDs, and at least 5 pieces of data within the ±0.01 deviation (Δuv) range at a correlated color temperature of 2800 to 2900 K were averaged and compared. Luminous intensities were compared using relative values, with the luminous intensity of Example 6 being 100%.

With regard to the luminous intensity, Example 8 was 100%, Comparative Example 8 was 89%, and Comparative Example 9 was 92%, and with regard to the general color rendering index (Ra), Example 8 was 78, Comparative Example 8 was 75, and Comparative Example 9 was 59.

The LED having the color of a warm white fluorescent lamp of Example 8 had a higher relative luminous intensity and slightly higher color rendering properties than Comparative Example 8. The width of the fluorescence spectrum of the phosphor was broader, and thus the color rendering properties were higher than those of Comparative Example 9.

Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. A phosphor represented by formula $M_x(Si,Al)_2(N,O)_{3\pm y}$, provided that M is Li and at least one alkaline earth metal element, $0.52 \leq x \leq 0.9$, $0.06 \leq y \leq 0.23$, and part of M is replaced by element Ce, wherein an Si/Al atomic ratio is 1.5 or greater and 6 or less, an o/N atomic ratio is 0 or greater and 0.1 or less, 5 to 50 mol % of M is Li, and 0.5 to 10 mol % of M is Ce, having an orthorhombic crystal structure and comprising a crystal with lattice constant a of 0.935 to 0.965 nm, a lattice constant b of 0.550 to 0.570 nm, and a lattice constant c of 0.480 to 0.500 nm.

2. The phosphor according to claim 1, wherein 0.5 to 5 mol % of M is Ce.

3. The phosphor according to claim 1, wherein the alkaline earth metal element is Ca.

4. The phosphor according to claim 1, consisting of the crystal and a heterogeneous crystal phase, a diffraction intensity of a most intense line of the heterogeneous crystal phase relative to a diffraction intensity of a most intense line of the crystal evaluated by powder X-ray diffractometry being 40% or less.

5. The phosphor according to claim 4, wherein the heterogeneous crystal phase is α-SiAlON, AlN, or $LiSi_2N_3$.

6. A light-emitting device comprising a phosphor of claim 1 and a light-emitting source.

7. The light-emitting device according to claim 6, wherein the light-emitting source emits ultraviolet or visible light.

8. An image display device comprising a light-emitting device of claim 6.

9. A lighting device comprising a light-emitting device of claim 6.

10. The phosphor according to claim 2, wherein the alkaline earth metal element is Ca.

11. The phosphor according to claim 2, having an orthorhombic crystal structure and comprising a crystal with a lattice constant a of 0.935 to 0.965 nm, a lattice constant b of 0.550 to 0.570 nm, and a lattice constant c of 0.480 to 0.500 nm.

12. The phosphor according to claim 3, having an orthorhombic crystal structure and comprising a crystal with a lattice constant a of 0.935 to 0.965 nm, a lattice constant b of 0.550 to 0.570 nm, and a lattice constant c of 0.480 to 0.500 nm.

13. A light-emitting device comprising a phosphor of claim 2 and a light-emitting source.

14. A light-emitting device comprising a phosphor of claim 3 and a light-emitting source.

15. A light-emitting device comprising a phosphor of claim 4 and a light-emitting source.

16. A light-emitting device comprising a phosphor of claim 5 and a light-emitting source.

17. An image display device comprising a light-emitting device of claim 7.

18. A lighting device comprising a light-emitting device of claim 7.

* * * * *